United States Patent
Ruby et al.

(10) Patent No.: US 6,714,102 B2
(45) Date of Patent: Mar. 30, 2004

(54) METHOD OF FABRICATING THIN FILM BULK ACOUSTIC RESONATOR (FBAR) AND FBAR STRUCTURE EMBODYING THE METHOD

(75) Inventors: Richard C. Ruby, Menlo Park, CA (US); Paul Bradley, Mountain View, CA (US); Yury Oshmyansky, Camarillo, CA (US); Domingo A. Figueredo, Union City, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 106 days.

(21) Appl. No.: 09/798,496

(22) Filed: Mar. 1, 2001

(65) Prior Publication Data

US 2002/0121405 A1 Sep. 5, 2002

(51) Int. Cl.[7] .................. H03H 9/00; H01L 41/04; E04B 1/82
(52) U.S. Cl. ............... 333/189; 181/293; 333/187; 310/365; 310/321
(58) Field of Search .............. 310/348, 349, 310/351–353; 181/293, 294, 296; 333/186–192; 29/25.35; 427/100

(56) References Cited

U.S. PATENT DOCUMENTS

| | | | | |
|---|---|---|---|---|
| 4,766,666 A | * | 8/1988 | Sugiyama et al. | 29/454 |
| 5,090,254 A | * | 2/1992 | Guckel et al. | 310/321 |
| 5,274,297 A | * | 12/1993 | Hermann et al. | 310/327 |
| 5,275,055 A | * | 1/1994 | Zook et al. | 310/330 |
| 5,690,841 A | * | 11/1997 | Elderstig | 216/39 |
| 5,759,870 A | * | 6/1998 | Yun et al. | 438/445 |
| 5,772,322 A | * | 6/1998 | Burns et al. | 331/156 |
| 5,903,087 A | * | 5/1999 | Mattson et al. | 310/330 |
| 6,182,513 B1 | * | 2/2001 | Stemme et al. | 310/346 |
| 6,215,375 B1 | * | 4/2001 | Larson et al. | 333/187 |
| 6,355,498 B1 | * | 3/2002 | Chan et al. | 438/48 |
| 6,384,697 B1 | * | 5/2002 | Ruby | 333/189 |
| 2001/0024820 A1 | * | 9/2001 | Mastromatteo et al. | 435/287.2 |
| 2002/0067106 A1 | * | 10/2001 | Sunwoo et al. | 333/187 |

OTHER PUBLICATIONS

Plummer, James D., Deal, Michael D., and Griffin, Peter B., "Silicon VLSI Technology—Fundamentals, Practice, and Modeling." New Jersey: Prentice Hall, Inc., pp. 618, 645, 2000.*

* cited by examiner

Primary Examiner—Robert Nappi
Assistant Examiner—Patrick Miller

(57) ABSTRACT

A method for fabricating an acoustic resonator, for example a Thin Film Bulk Acoustic Resonators (FBAR), on a substrate. A depression is etched and filled with sacrificial material. The FBAR is fabricated on the substrate spanning the depression, the FBAR having an etch hole. The depression may include etch channels in which case the FBAR may include etch holes aligned with the etch channels. A resonator resulting from the application of the technique is suspended in air and includes at least one etch hole and may include etch channels.

16 Claims, 3 Drawing Sheets

METHOD OF FABRICATING THIN FILM BULK ACOUSTIC RESONATOR (FBAR) AND FBAR STRUCTURE EMBODYING THE METHOD

BACKGROUND

The present invention relates to the art of acoustic resonators. More particularly, the present invention relates to electro-mechanical resonators that may be used as filters for electronic circuits.

The need to reduce the cost and size of electronic equipment has led to a continuing need for smaller signal filtering elements. Thin Film Bulk Acoustic Resonators (FBARs) and Stacked Thin Film Bulk Wave Acoustic Resonators and Filters (SBARs) represent one class of filter element with potential for meeting these needs. For brevity, these filter elements will be referred to as FBARs.

An FBAR is constructed from acoustic resonators using bulk longitudinal acoustic waves in thin film piezoelectric (PZ) material. In one simple configuration, as illustrated in FIG. 1, the FBAR 100 includes a layer of PZ material 102 is sandwiched between two metal electrodes 104 and 106. The sandwich structure 100 is preferably suspended in air by supporting it around the perimeter. When an electric field is created between the two electrodes 104 and 106 via an impressed voltage, the PZ material 102 converts some of the electrical energy into mechanical energy in the form of waves. The waves propagate in the same direction as the electric field and reflect off of the electrode/air interface at some frequency including at a resonance frequency. At the resonance frequency, the device 100 can be used as an electronic resonator; hence, the device can act as a filter. Using this technique, resonators for applications in the GHz range may be constructed with physical dimensions less than 100 microns in diameter and few microns in thickness.

The FBARs can be fabricated using deposition techniques commonly used for fabricating integrated circuit elements on a substrate material. However, the FBAR fabrication processes pose unique challenges because the FBARs are preferably suspended in air. To fabricate a suspended FBAR, one technique has been to first deposit the FBAR onto a substrate, then to completely remove the substrate under the FBAR. This is illustrated in FIG. 1 where the substrate 110 under the FBAR has been removed to suspend the FBAR. However, the removal of the substrate under the FBAR exposes the FBAR and causes mechanical integrity problems. Further, it is difficult to etch the underside of the substrate.

Another technique to fabricate a suspended FBAR has been to first deposit and pattern a layer of temporary support film on the top surface of the substrate. Next, to fabricate the FBAR above the temporary support film. Then, to remove temporary support film using an undercutting etch. This technique, similar to the first technique (the substrate removal technique), causes mechanical integrity problems with the resulting FBAR. Moreover, complete removal of the temporary support film is difficult leading to inconsistent or incomplete etching of the temporary support film. And, the undercutting etch may leave effluent which may not be completely removed, causing additional problems.

Accordingly, there remains a need for an improved technique to fabricate suspended FBARs including efficient removal of sacrificial material, and for an apparatus allowing the efficient removal of the sacrificial material.

SUMMARY

These needs are met by the present invention. According to one aspect of the present invention, an apparatus has a substrate having a depression on a top surface. On the substrate, an acoustic resonator is fabricated spanning the depression, the acoustic resonator having an etch hole providing access to the depression.

According to a second aspect of the present invention, a method of fabricating an acoustic resonator on a substrate having a top surface is disclosed. First, a depression is etched on the top surface and the depression is filled with sacrificial material. Next, the acoustic resonator is fabricated on the substrate, the acoustic resonator having an etch hole. Finally, the sacrificial material is removed.

According to a third aspect of the present invention, an apparatus has a substrate having a depression on a top surface, the depression having etch channels. An acoustic resonator is fabricated on the substrate and over the depression.

According to a fourth aspect of the present invention, a method of fabricating an acoustic resonator on a substrate having a top surface is disclosed. First, a depression is etched on the top surface of the substrate, the depression having at least one etch channel, and the depression is filled with sacrificial material. Next, the acoustic resonator on the substrate is fabricated on the substrate. Finally, sacrificial material is removed.

Other aspects and advantages of the present invention will become apparent from the following detailed description, taken in combination with the accompanying drawings, illustrating by way of example the principles of the invention.

DETAILED DESCRIPTION

Figure 1:
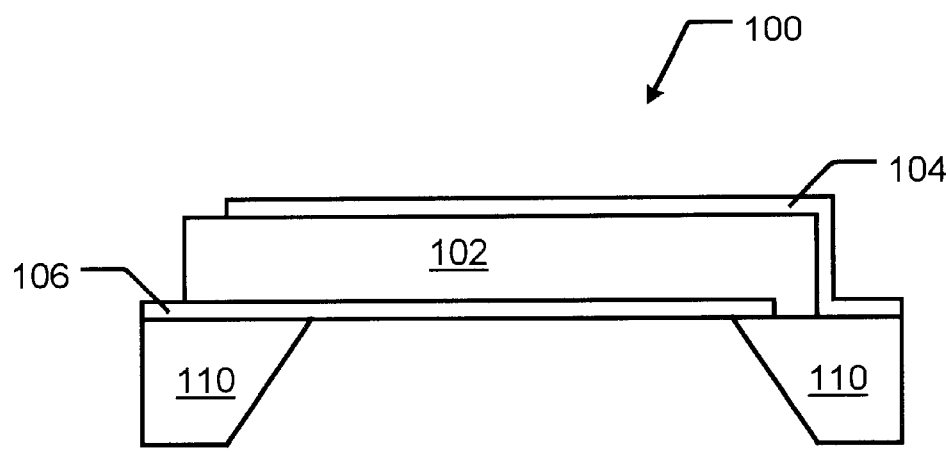
FIG. 1 illustrates a cross section of a prior art FBAR.

As shown in the drawings for purposes of illustration, the present invention is embodied in a technique of fabricating an acoustic resonator (for example, and FBAR) on a substrate. In one embodiment, a depression is etched on the top surface of the substrate and the depression is filled with sacrificial material. Next, an FBAR is fabricated on top of the sacrificial material, the FBAR having at least one etch hole. Then, the sacrificial material is removed through the etch hole. In another embodiment, the depression includes at least one etch channel through which the sacrificial material is removed. The etch channels may be aligned with etch holes.

FBARs fabricated using the present technique have advantages over the prior art FBARs. Firstly, because the substrate is not completely removed under the FBAR, the FBAR is protected and receives better mechanical support during processing. Additionally, the sacrificial material is removed quickly and completely. Thus, problems arising from prolonged exposure to etching solution are minimized and problems associated with inconsistent or incomplete etching of the sacrificial material is minimized.

Figure 2A:
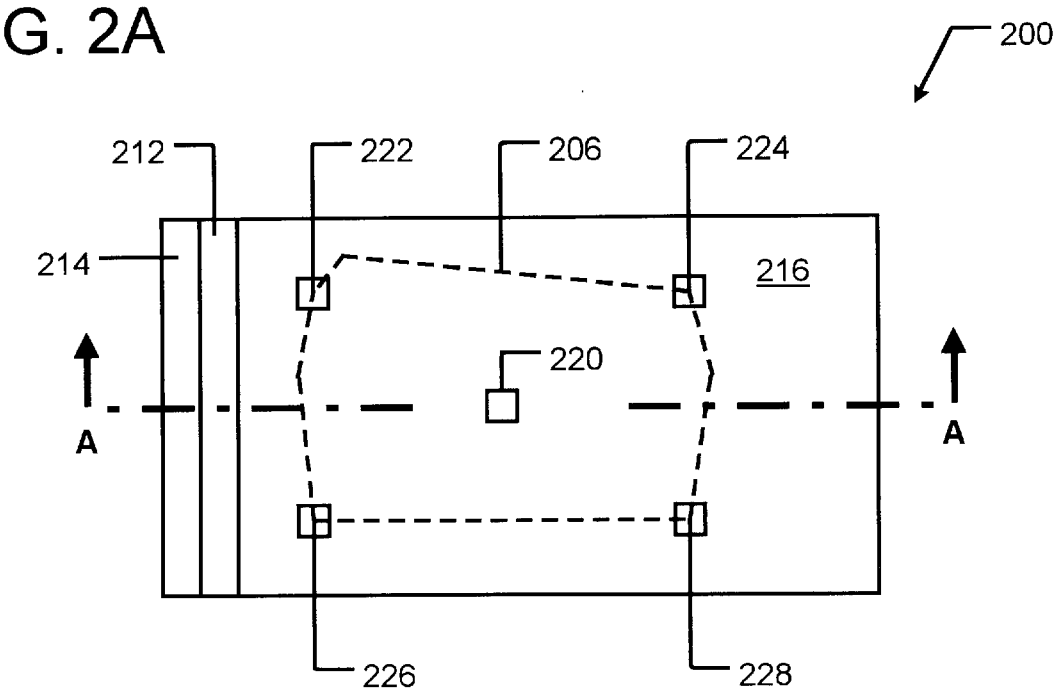
FIG. 2A is a top view of an FBAR according to one embodiment of the present invention.
Figure 2B:
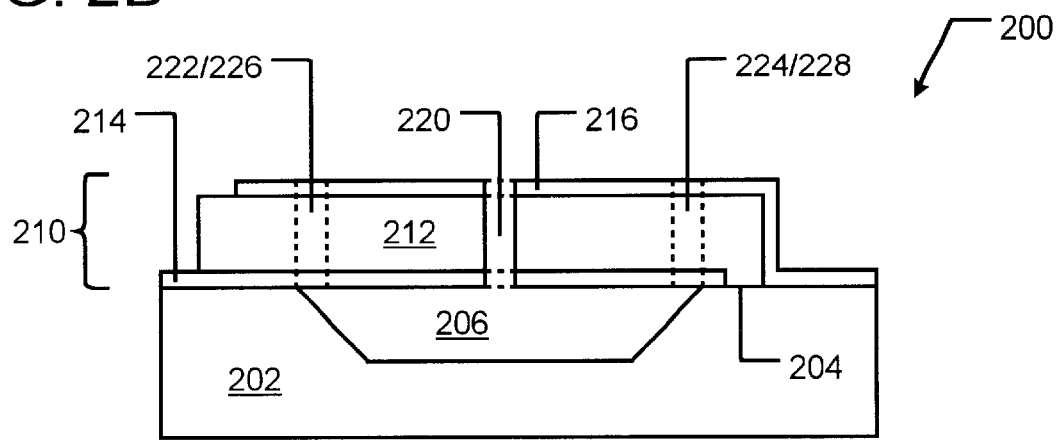
FIG. 2B is a cross sectional view of the FBAR of FIG. 2A.

FIG. 2A illustrates a top view of an apparatus 200 according to one embodiment of the present invention. FIG. 2B illustrates a cross sectional side view of the apparatus 200 along line A—A of FIG. 2A. Referring to FIGS. 2A and 2B, the apparatus 200 includes a substrate 202 having a top surface 204. The substrate 202 includes a depression 206 etched on the top surface 204. In FIG. 2A, the depression 206 is illustrated by an area 206 defined by a dash-lined polygon. The polygon shaped area 206 is the area defined by the depression 206. The shape of the depression 206, or "swimming pool," is not restricted to rectangular or orthogonal shapes. In fact, the area 206 covered by the depression 206 may be shaped as any polygon, for example, a quadrilateral or a pentagon. In one preferred embodiment, the area 106 defined by the depression 206 is shaped as a polygon having edges and vertices where no two edges are parallel to the other, no two vertices have the same angle as the other, or both.

An FBAR 210 is fabricated on the substrate 202 spanning the depression 206. The FBAR 210 includes a layer of piezoelectric (PZ) material 212 sandwiched between a first electrode 214 and a second electrode 216. The FBAR 210 includes an etch hole 220 providing access to the depression 206. The etch hole 220 includes a hole through the PZ material 212 and through the electrodes 214 and 216, these holes aligned to form the etch hole 220 extending from the depression 206 to top of the FBAR 210. In one embodiment, the etch hole 210 is at substantially center of the depression 206 defined by the depression 206, and the etch hole 220 may be in the order of 10 microns in diameter; but can be range from less than one to 40 microns or more.

The FBAR may include additional etch holes such as etch holes 222, 224 226, and 228. In the illustrated embodiment, the etch holes are placed at or near selected vertices, or corners, of the area 206 defined by the depression 206.

The apparatus 200 is fabricated by first etching the top surface 204 of the substrate 202 to create a depression 206. In one embodiment, the depression 206 may be about three microns deep and about 10,000 to 30,000 square microns in area. These values may vary widely for fabricating different sized resonators, different frequency resonators, using different materials, or any combination of these or other factors. The substrate 202 may be Silicon or other suitable material. Next, the depression 206 is filled with sacrificial material such as phosphor silica glass (PSG) and polished to form a smooth surface even with the top surface 204 of the substrate 202. Then, the FBAR 210 is fabricated on the top surface 204 of the substrate 202 spanning the depression area 206 now filled with the sacrificial material. Additional information regarding the techniques for fabricating portions of the apparatus 200 can be found in U.S. Pat. No. 6,060,818 issued on May 9, 2000 to Ruby et al. The U.S. Pat. No. 6,060,818 patent is incorporated herein by reference. For the present invention, the layers 214, 212, and 216 of the FBAR 210 are fabricated having at least one etch hole 220. Moreover, the FBAR may be fabricated to have additional etch holes 222, 224, 226, and 228.

Finally, the sacrificial material in the depression 206 is removed by introducing the apparatus 200 to an etch solution, for example a diluted hydro fluoric acid, $H_2O:HF$. The etch hole 220 (and any other etch holes such as 222, 224, 226, and 228) provides for quick and complete access to the depression 206 by the etch solution for the purpose of etching the sacrificial material. When the etch solution dissolves the sacrificial material, effluent forms. In the present invention, the effluent is efficiently removed from the depression 206 through the etch hole 220 and any additional etch holes such as 222, 224, 226, and 228.

Figure 3A:
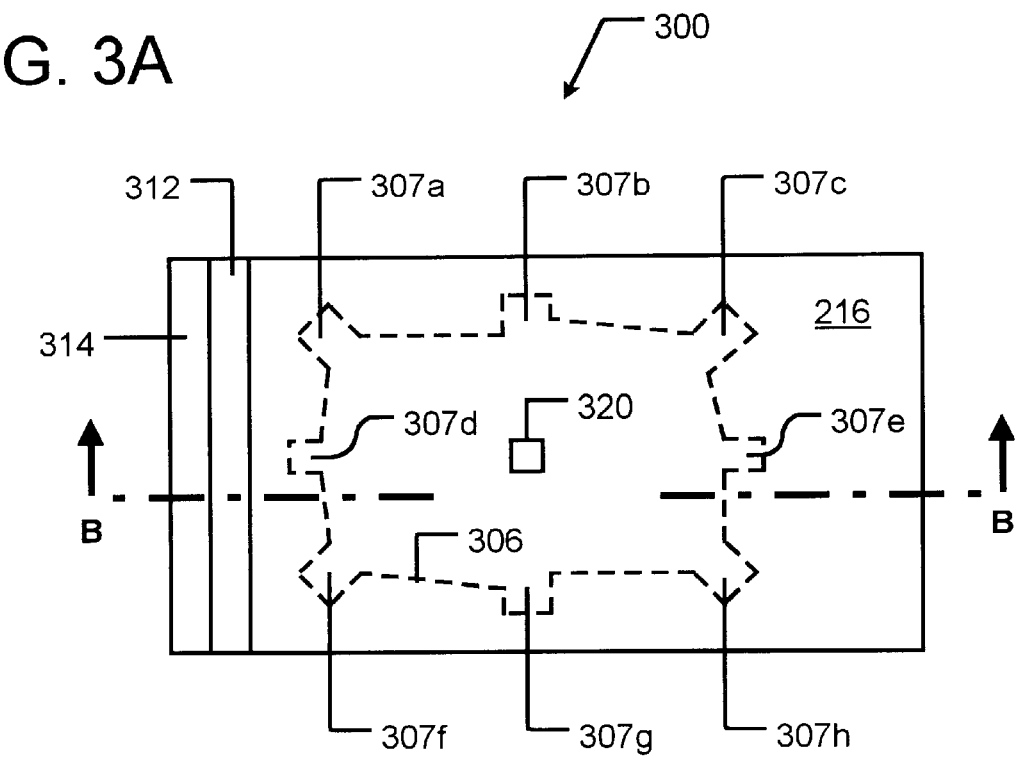
FIG. 3A is a top view of an FBAR according to another embodiment of the present invention.

FIG. 3A illustrates a top view of an apparatus 300 according to another embodiment of the present invention.

Figure 3B:
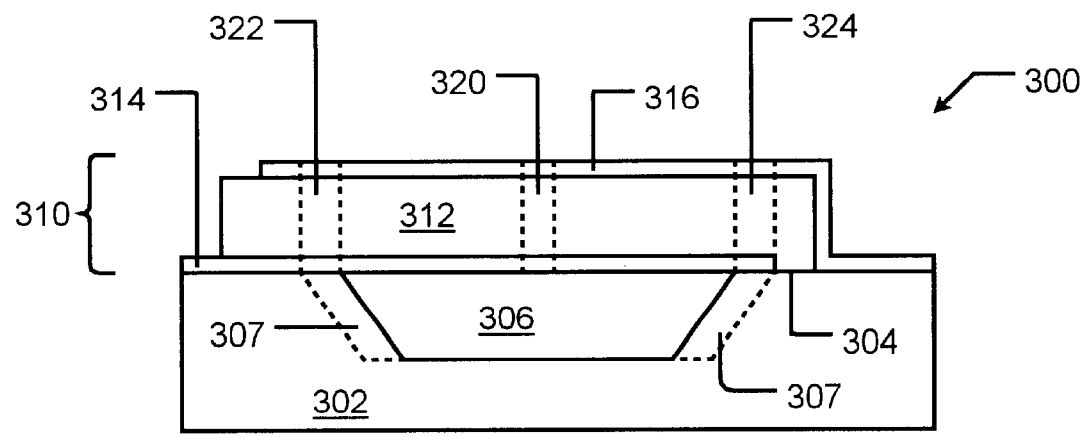
FIG. 3B is a cross sectional view of the FBAR of FIG. 3A.

FIG. 3B illustrates a cross sectional side view of the apparatus 300 along line B—B of FIG. 3A. Referring to FIGS. 3A and 3B, the apparatus 300 includes a substrate 302 having a top surface 304. The substrate 302 includes a depression 306 etched on the top surface 304. In FIG. 3A, the depression 306 is illustrated by a polygon area 306 using dashed line. In the illustrated embodiment of FIG. 3A, the depression 306 includes etch channels 307a, 307b, 307c, 307d, 307e, 307f, 307g, and 307h. For brevity, the etch channels are referred to, collectively, as 307 herein after and in FIG. 3B. FIG. 3A shows eight etch channels 307 for the purposes of illustration; however, the number of channels are not required to be or limited to eight.

An FBAR 310 is fabricated on the substrate 302 spanning the depression 306 including the etch channels 307. The FBAR 310 includes a layer of piezoelectric (PZ) material 312 sandwiched between a first electrode 314 and a second electrode 316. The FBAR includes an etch hole 320 providing access to the depression 306. In one embodiment, the etch hole 310 is at substantially center of the area 306 defined by the depression 306, and the etch hole 320 may be in the order of 10 microns in diameter.

The FBAR 310 may include additional etch holes such as etch holes 322 and 324 shown in FIG. 3B but not in FIG. 3A. The etch holes 322 and 324 are not shown in FIG. 3A to avoid obfuscating the etch channels 307. This is because, in one embodiment, an etch hole (322, 324, or another etch holes not shown in either 3A or 3B) is fabricated aligned with each of the etch channels 307.

Fabrication process for the apparatus 300 is similar to that of the apparatus 200 shown in FIGS. 2A and 2B and as described above. However, when the depression 306 is etched, the etch channels 307 must be etched as a part of the depression 306. And, sacrificial material is also deposited within the etch channels 307 until removed later in the process. The etch holes 322, 324, and others are preferably fabricated aligned with one of the etch channels 307.

Finally, the sacrificial material occupying the depression 306 is removed by introducing the apparatus 300 to an etch solution.

The channels 307 and the etch hole 320 (and any other etch holes such as 322, 324, and others) provide for quick and complete access to the depression 306 by the etch solution for the purpose of etching the sacrificial material. The effluent is efficiently removed from the depression 306 through the channels and the etch hole 320 and any additional etch holes.

From the foregoing, it will be appreciated that the present invention is novel and offers advantages over the current art. The present invention results in a more mechanically sound FBARs and minimizes the problems arising from prolonged exposure to etching solution, inconsistent or incomplete etching of the sacrificial material, or both. Although a specific embodiment of the invention is described and illustrated above, the invention is not to be limited to the specific forms or arrangements of parts so described and illustrated. For example, the present invention may be applicable for SBARs or other devices requiring removal of material between the device and its substrate. The invention is limited only by the claims that follow.

What is claimed is:

1. An apparatus comprising:
   a substrate having a depression on a top surface, the depression defining at least one etch channel; and
   an acoustic resonator fabricated on the substrate and spanning the depression, the acoustic resonator having an etch hole providing access to the depression.

2. The apparatus recited in claim 1 wherein the depression defines an area on the top surface of the substrate and the etch hole is aligned with one of the etch channels at substantially center of the area.

3. An apparatus comprising:

a substrate having a depression on a top surface;

an acoustic resonator fabricated on the substrate and spanning the depression, the acoustic resonator having an etch hole providing access to the depression and wherein the depression defines an area on the top surface of the substrate and the etch hole is at substantially center of the area; and wherein in the area is shaped as a polygon and the apparatus further comprising additional etch holes, one etch hole at selected vertices of the polygon area.

4. The apparatus recited in claim 3 wherein the polygon shaped area has edges, no two edges being parallel to the other.

5. The apparatus recited in claim 3 wherein the polygon shaped area has vertices defining angles, no two vertices having a same angle.

6. The apparatus recited in claim 1 wherein the acoustic resonator is thin film bulk acoustic resonator comprising a piezoelectric material sandwiched between two electrodes.

7. A method of fabricating an acoustic resonator on a substrate having a top surface, said method comprising steps of:

etching a depression in said top surface, the depression defining having etch channels;

filling said depression with a sacrificial material;

fabricating the acoustic resonator on the substrate, the acoustic resonator having an etch hole; and removing the sacrificial material.

8. The method recited in claim 7 wherein the depression defines an area on the top surface of the substrate and the etch hole is at substantially center of the area.

9. A method of fabricating an acoustic resonator on a substrate having a top surface, said method comprising steps of:

etching a depression in said top surface;

filling said depression with a sacrificial material;

fabricating the acoustic resonator on the substrate, the acoustic resonator having an etch hole;

removing the sacrificial material; and wherein the depression defines an area on the top surface of the substrate and the etch hole is at substantially center of the area and wherein the area has a polygon shape and the apparatus further comprising additional etch holes, one etch hole at each of selected vertices of the polygon area.

10. An apparatus comprising:

a substrate having a depression on a top surface, the depression having defining etch channels; and an acoustic resonator fabricated on the substrate and over the depression, said acoustic resonator having etch holes aligned with the etch channels of said substrate.

11. The apparatus recited in claim 10 wherein the depression defining an area on the top surface and wherein the etch hole is located at substantially center of the area.

12. A method of fabricating an acoustic resonator on a substrate having a top surface, said method comprising steps of:

etching a depression in the top surface, the depression defining having at least one etch channel;

filling the depression with a sacrificial material;

fabricating the acoustic resonator on the substrate, the resonator defining at least one etch hole; and removing the sacrificial material through the etch hole.

13. The method recited in claim 12 wherein the depression defines an area on the top surface of the substrate and the etch hole is at substantially center of the area.

14. The method recited in claim 12 further comprising the step of fabricating a plurality of etch channels and a plurality of etch holes, each etch hole aligned with an etch channel.

15. The method recited in claim 12 wherein the depression defines a polygon shaped area having edges, no two edges being parallel to the other.

16. The method recited in claim 15 wherein the depression defines a polygon shaped area having vertices defining angles, no two vertices having a same angle.

* * * * *